United States Patent [19]
Oto

[11] Patent Number: 5,170,498
[45] Date of Patent: Dec. 8, 1992

[54] BAND SWITCHING FILTER AND SATELLITE BROADCAST RECEIVING SYSTEM USING THE SAME

[75] Inventor: Hideki Oto, Fukaya, Japan

[73] Assignee: Kabushiki Kaisha Toshiba, Kawasaki, Japan

[21] Appl. No.: 459,962

[22] Filed: Jan. 2, 1990

[30] Foreign Application Priority Data

Jan. 5, 1989 [JP] Japan .................... 64-109

[51] Int. Cl.$^5$ ................ H04B 1/16; H04B 1/26
[52] U.S. Cl. ................ 455/190.1; 455/200.1; 455/339; 455/341
[58] Field of Search ........... 455/188, 189, 191, 190, 455/200, 314, 339, 340, 341

[56] References Cited

U.S. PATENT DOCUMENTS 4,385,402  5/1983  Barrs ........................ 455/339
4,619,000  10/1986  Ma ........................... 455/131
4,736,457  4/1988  Kupfer ...................... 455/188

FOREIGN PATENT DOCUMENTS 0190730  10/1984  Japan .
0100836  6/1985  Japan .

Primary Examiner—Reinhard J. Eisenzopf
Assistant Examiner—Chi H. Pham
Attorney, Agent, or Firm—Cushman, Darby & Cushman

[57] ABSTRACT

A band switching filter circuit includes a first filter for filtering an input signal with predetermined characteristics to output a first filtered signal, and a second filter for filtering the first filtered signal output from the first filter with frequency characteristics of a band narrower than that of the frequency characteristics of the first filter to output a second filtered signal. A switching circuit selects the first filtered signal output from the first filter or the second filtered signal output from the second filter in accordance with the level of an input control signal.

6 Claims, 3 Drawing Sheets

BAND SWITCHING FILTER AND SATELLITE BROADCAST RECEIVING SYSTEM USING THE SAME

BACKGROUND OF THE INVENTION

1. Field of the Invention

The present invention relates to a satellite broadcast receiving system using a band switching filter and, more particularly, to a band switching filter circuit used as a bandpass filter for a second converter in, e.g., a satellite broadcast system.

2. Description of the Related Art

A conventional satellite broadcast receiving system includes a first converter for block down-conversion on a signal received by an outdoor parabolic antenna. The down converted signal is converted into a 1 to 1.5 GHz signal. A second converter is included for converting an output from the first converter into an IF frequency signal (e.g., 140 MHz).

The second converter includes a bandpass filter for band-limiting the obtained IF signal into a signal of 27 MHz in, e.g., Japan.

The bandwidth of the bandpass filter is fixed when a signal having a predetermined broadcast format is received, e.g., in a satellite broadcast service. However, the bandwidth must be set in correspondence with each signal source when a signal from a communication satellite is received. Therefore, in this case, the bandpass filter is needed to serve as a band switching filter.

A conventional band switching filter includes first and second bandpass filters connected in parallel between input and output terminals. The frequency characteristics of the first and second bandpass filters are different from each other. A pair of switching transistors receive a control signal and are alternately turned on/off to perform the band switching.

Each filter used in the band switching filter with the above arrangement must have high performance. When a high-performance filter is designed, the number of stages increases (e.g., in an LC filter) an LC filter. The number of comb electrodes in a surface acoustic wave filter increases also used therein is increased. Therefore, manufacturing cost of the conventional band switching filter having two high-performance filters is undesirably increased.

Since the switching transistors used in the switching filter correspond to the bandpass filters to perform band switching, the arrangement is undesirably complicated.

SUMMARY OF THE INVENTION

It is, therefore, an object of the present invention to provide a band switching filter circuit which can obtain sufficient band characteristics even if a filter having moderate frequency characteristics is used, and a satellite broadcast receiving system using the band switching filter circuit.

It is another object of the present invention to provide a band switching filter circuit having a simplified switching circuit and a satellite broadcast receiving system using the band switching filter circuit.

In order to achieve the above objects, according to the present invention, there is provided a band switching filter circuit comprising:

a first filter for filtering an input signal with predetermined frequency characteristics to output a first filtered signal;

a second filter for filtering the first filtered signal output from said first filter with frequency characteristics of a band narrower than that of the frequency characteristics of said first filter to output a second filtered signal; and switching means for selecting one of the first filtered signal output from said first filter and the second filtered signal output from said second filter in accordance with a level of a control signal supplied to said switching means.

According to the present invention, there is provided a satellite broadcast receiving system comprising:

means for receiving a broadcast signal;

converter means for converting the broadcast signal received by said receiving means into a signal having a predetermined frequency;

frequency converting means for converting the signal converted by said converter means into a signal having an intermediate frequency;

a first filter for filtering the signal frequency-converted by said frequency converting means with predetermined frequency characteristics to output a first filtered signal;

a second filter for filtering the first filtered signal output from said first filter with frequency characteristics of a band narrower than that of the frequency characteristics of said first filter to output a second filtered signal;

switching means for selecting one of the first filtered signal output from said first filter and the second filtered signal output from said second filter in accordance with a level of a control signal supplied to said switching means, and for outputting it as a selected signal; and demodulating means for demodulating the selected signal output by said switching means.

BRIEF DESCRIPTION OF THE DRAWINGS

The above and other objects of the present invention will be described below in detail with reference to the accompanying drawings.

DETAILED DESCRIPTION OF THE PREFERRED EMBODIMENTS

A satellite broadcast receiving system to which a band switching filter circuit of the present invention is applied will be described hereinafter with reference to FIG. 1A.

Figure 1A:
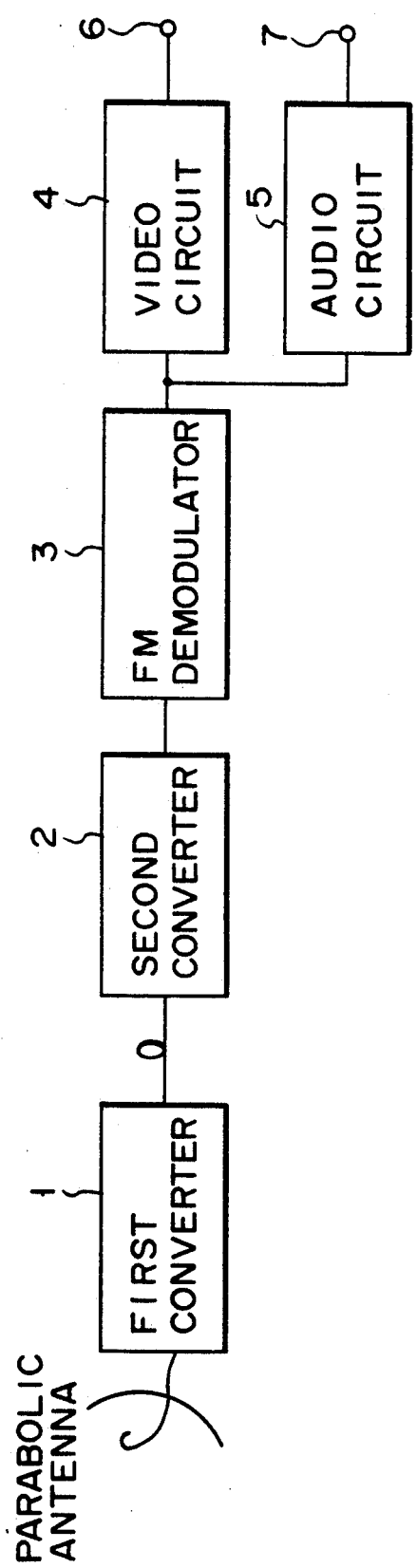
FIG. 1A is a block diagram for explaining a satellite broadcast receiving system.

In general, the receiving system for a satellite broadcast service has an arrangement shown in FIG. 1A. More specifically, a signal received by an outdoor parabolic antenna is block down-converted into a signal of 1 to 1.5 GHz by a first converter 1 mounted on the antenna. A second converter 2 converts a signal from the first converter 1 into a signal having an IF frequency (e.g., 140 MHz) to supply the converted signal to an FM demodulator 3. The FM demodulator 3 supplies the demodulated output to a video circuit 4 and an audio circuit 5. Signals from the circuits 4 and 5 are supplied to output terminals 6 and 7, respectively.

Figure 1B:
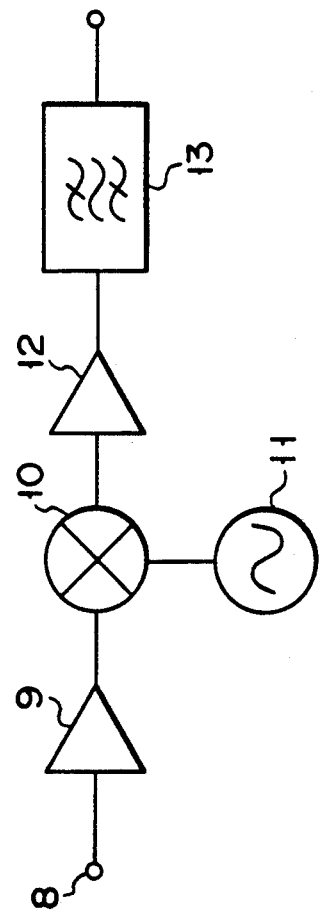
FIG. 1B is a circuit diagram showing an arrangement of a part of the system shown in FIG. 1A.

FIG. 1B is a circuit diagram showing a detailed arrangement of the second converter 2. The signal of 1 to 1.5 GHz supplied to an input terminal 8 is amplified by a pre-amplifier 9, and the amplified signal is converted into a signal having an IF frequency by a frequency converting unit consisting of a mixer circuit 10 and a local oscillation circuit 11. This IF signal is input to a bandpass filter 13 through an amplifier 12, and is band-limited to a signal of, e.g., 27 MHz.

Figure 2:
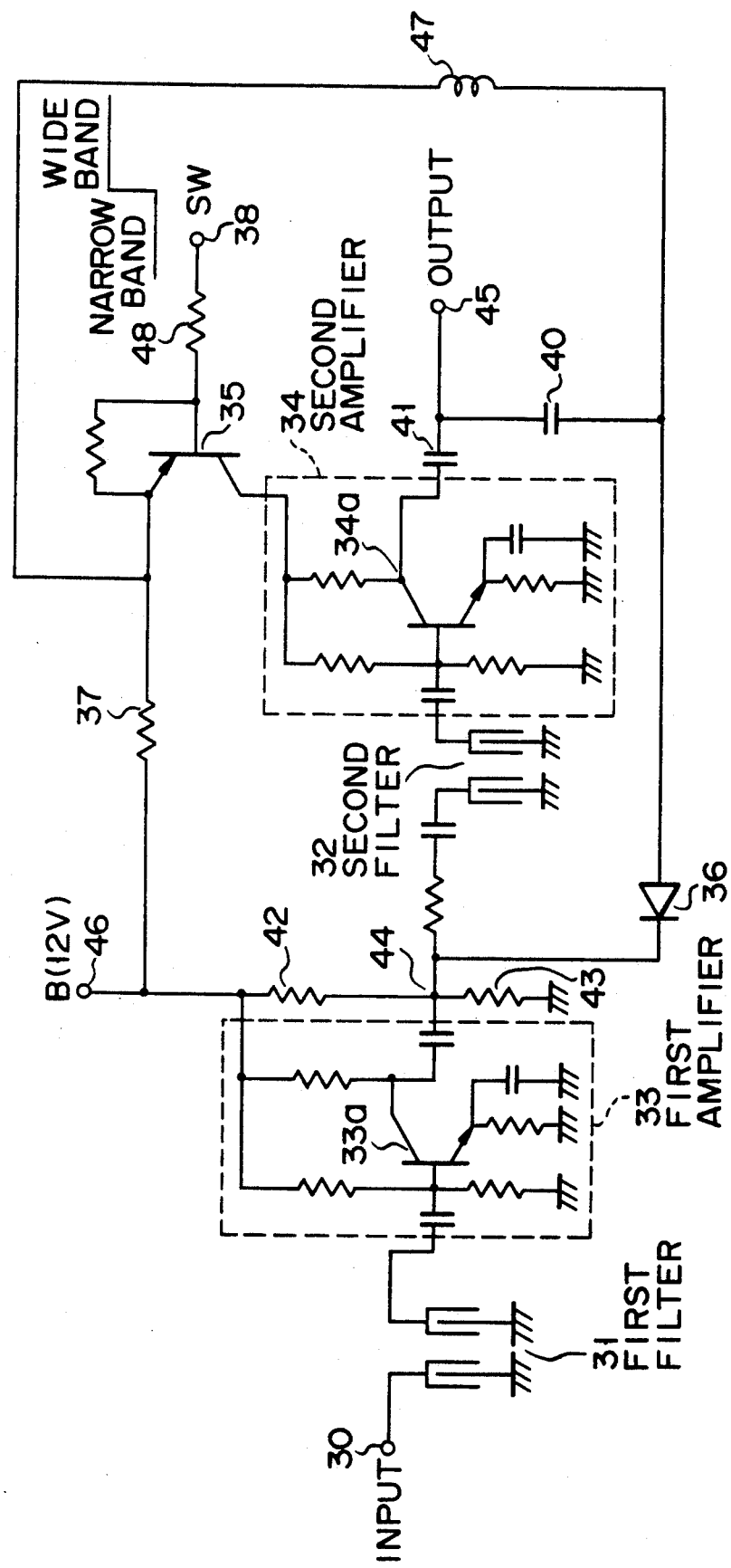
FIG. 2 is a circuit diagram showing an arrangement of a band switching filter according to an embodiment of the present invention.

FIG. 2 is a circuit diagram showing a band switching filter circuit serving as the bandpass filter according to an embodiment of the present invention.

Referring to FIG. 2, an input terminal 30 receives a signal converted into a signal having an IF frequency. This IF signal is supplied to a first amplifier 33 including a transistor 33a through a first filter 31 using a surface acoustic wave element. This amplifier 33 compensates an attenuation in signal caused by passing through the first filter 31. The first filter 31 serves as a bandpass filter having a 3 dB bandwidth of 32 MHz, and the first amplifier 33 is operated by a voltage of 12 V from a voltage source terminal 46.

Series-connected resisters 42 and 43 serving as a bias circuit are arranged between the voltage source terminal 46 and ground.

An output from the first amplifier 33 is supplied to a second amplifier 34 including a transistor 34a through a second filter 32 consisting of a surface acoustic wave element. The amplifier 34 compensates an attenuation in signal caused by passing through the second filter 32. The second filter 32 serves as a bandpass filter having a 3 dB bandwidth of 27 MHz, and the second amplifier 34 is connected to the voltage source terminal 46 through the collector-emitter path of a switching transistor 35 of a pnp type and a resistor 37. When the type of satellite or the broadcast format must be changed, a bandwidth switching signal SW is applied to the base of the switching transistor 35 from a control terminal 38 through a resistor 48. That is, when the receiving system receives a changing signal, a CPU (not shown) judges which bandwidth is selected based on the changing signal, and a bandwidth switching signal SW of a predetermined level is generated in accordance with the judgement and applied to the control terminal 38. Also, users can make a selection manually among the two bandwidths.

A series circuit consisting of a diode 36 and a capacitor 40 is connected between a node 44 of the resistors 42 and 43 serving as an output terminal of the first amplifier 33 and an output terminal 45 of the second amplifier 34. The node of this series circuit is connected to the emitter of the switching transistor 35 through a coil 47. Note that the cathode of the diode 36 is connected to the node 44 of the series-connected resistors 42 and 43, and the anode thereof is connected to the coil 47.

An operation of the band switching filter circuit with the above arrangement will be described hereinafter.

CHANGE TO WIDE BAND

When the bandpass characteristics are increased up to 32 MHz, an output from the first amplifier 33 is directly supplied to the output terminal 45 without passing through the second amplifier 34. More specifically, in this case, the switching signal SW is set at high level, and the switching transistor 35 is OFF. For this reason, a voltage from the voltage source terminal 46 is not applied to the second amplifier 34, and hence the second amplifier 34 does not amplify the signal. On the other hand, if the transistor 35 is OFF, the potential of the emitter is substantially equal to the voltage of the voltage source terminal 46. In addition, the voltage at the node 44 is lower than that of the voltage source terminal 46. For this reason, a potential difference occurs across both the terminals of the diode 36, and the diode 36 is turned on. Therefore, a signal of 32 MHz is directly supplied from the first amplifier 33 to the output terminal 45 through the diode 36 and the capacitor 40.

CHANGE TO NARROW BAND

When the switching signal SW goes to low level, i.e., the ground level, the transistor 35 is turned on. When the transistor 35 is turned on, a current is supplied through the collector-emitter path, and a power source voltage is applied to the second amplifier 34. Therefore, a signal from the first amplifier 33 is band-limited by the second filter 32, and the limited signal is supplied to the output terminal 45 through the second amplifier 34.

On the other hand, when the transistor 35 is turned on, a voltage drop across the resistor 37 decreases an anode potential of the diode 36 as compared with that obtained when the transistor 35 is OFF. For this reason, the diode 36 is turned off, and does not perform a bypass operation for the signal from the first amplifier 33. In this case, therefore, a signal of 27 MHz is obtained at the output terminal 45.

Thus, in order to obtain a wide band, the characteristics of the first filter 31 are utilized. In order to obtain a narrow band, the signal is passed through the first and second filters 31 and 32. As a result, an output in accordance with the characteristics of the second filter 32 is obtained.

In response to an ON/OFF operation of the switching transistor 35, the bypass diode 36 can be turned on/off to switch the characteristics. Two switching transistors used in the conventional filter are not required. In general, a high-performance bandpass filter must satisfy the following conditions:

(1) characteristics in a pass band are excellent
(2) sufficient attenuation in a stop band can be obtained.

The present invention has the following advantages over the above conditions. That is, in this embodiment, an element having excellent filter characteristics such as a surface acoustic wave element is used as the second filter 32 in the same manner as in the first filter 31.

Figure 3:
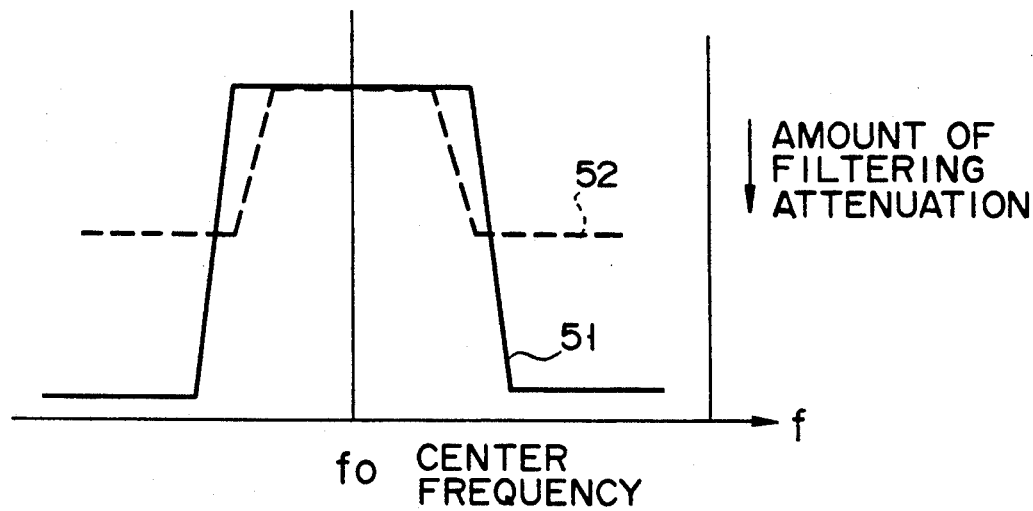
FIG. 3 is a graph showing frequency characteristics by comparing characteristics of a pair of filters used in the circuit shown in FIG. 2.

As shown in FIG. 3, however, if the first filter 31 has excellent stop-band characteristics (represented by a solid curve 51), the characteristics of the second filter 32 (represented by a broken curve 52) may be inferior to those of the first filter 31. Therefore, if a high performance element is used as the first filter 31, extremely good characteristics are not required for the second filter 32, thus achieving easy design. In addition, when the filter consists of a surface acoustic wave element, the filter is relatively free from an influence of impedance of the preceding and succeeding stages. Therefore, desired characteristics can be obtained even if a switching circuit is not arranged in the preceding and succeeding stages.

Figure 4:
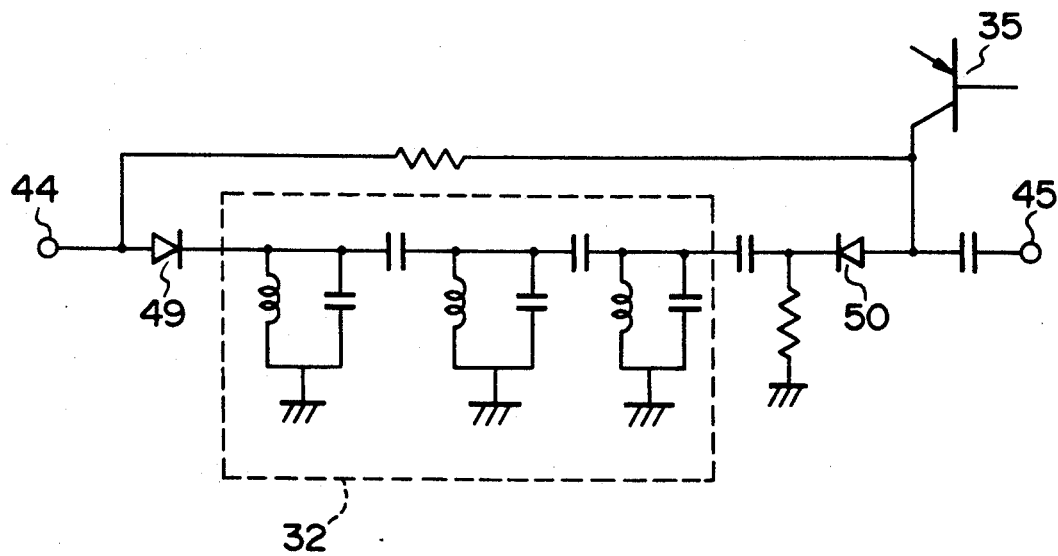
FIG. 4 is a circuit diagram showing another embodiment in which an LC filter is used as a band switching filter.

FIG. 4 is a circuit diagram showing an arrangement of the second filter 32 using an LC filter. The same reference numerals in FIG. 4 denote the same elements as shown in the embodiment depicted in FIG. 2. More specifically, an input terminal shown in FIG. 4 corresponds to the node 44 of the resistors 42 and 43 in FIG. 2. A signal from the terminal 44 is input to the second filter 32 consisting of an LC circuit through a pin diode 49. An output from the second filter 32 is supplied to an output terminal 45 through a pin diode 50. In this case, the pin diodes 49 and 50 are ON/OFF-controlled by a collector voltage of the switching transistor 35.

In the above embodiment, a bandwidth can be switched following the same operations as in the embodiment shown in FIG. 2 if the circuit is arranged such that a current supplied when the pin diodes 49 and 50 serving as the switching circuit are turned on is larger than a current supplied when the switching diode 36 is turned on. Note that a loss of the signal is small when the LC filter is used, therefore, the amplifier shown in FIG. 2 can be removed from the band switching filter circuit.

In addition, when several filters are further connected in series to constitute a similar switching circuit, the number of switches can be increased.

As described above, according to the present invention, when one filter having a wide band is provided with excellent characteristics, sufficient characteristics can be obtained in all bands at low cost.

What is claimed is:

1. A band switching filter circuit, comprising:

first filter means having predetermined frequency characteristics for filtering an input satellite broadcast signal and outputting an amplified first filtered signal, said first filter means including a first surface acoustic wave filter element and a first amplifier element connected to said first surface acoustic wave filter element, said first amplifier element compensating a signal from said first surface acoustic wave filter element;

second filter means having frequency characteristics of a band narrower than that of said frequency characteristics of said first filter means for filtering said amplified first filtered signal output from said first filter means, and outputting an amplified second filtered signal, said second filter means including a second surface acoustic wave filter element and a second amplifier element connected to said second surface acoustic wave filter element, said second amplifier element compensating a signal from said second surface acoustic wave filter element; and switching means capable of selecting from a first condition wherein said amplified first filtered signal is supplied to a signal output terminal and a second condition wherein said first filter means supplies said amplified first filtered signal to said second filter means which outputs said amplified second filtered signal to said signal output terminal, in said first condition, said second filter means is not operated and in said second condition, said second filter means is operated, said switching means including first switching means arranged between said first filter means and said signal output terminal, and second switching means for controlling operations of said second amplifier element and said first switching means by means of a switching signal.

2. A circuit according to claim 1, wherein said second switching means comprises:

a switching transistor turned on/off in accordance with a level of said switching signal; and said first switching means comprises:

a diode means, coupled to said switching transistor and said first amplifier element, and enabled in response to an ON/OFF operation of said switching transistor.

3. A band switching filter circuit, comprising:

first filter means having predetermined frequency characteristics for filtering an input satellite broadcast signal and outputting an amplified first filtered signal, said first filter means including a first surface acoustic wave filter element and a first amplifier element connected to said first surface acoustic wave filter element, said first amplifier element compensating a signal from said first surface acoustic wave filter element;

second filter means, coupled in series with said first filter means, and having frequency characteristics of a band narrower than that of said frequency characteristics of said first filter means, for filtering said amplified first filtered signal output from said first filter means, and outputting an amplified second filtered signal, said second filter means including a second surface acoustic wave filter element and a second amplifier element connected to said second surface acoustic wave filter element, said second amplifier element compensating a signal from said second surface acoustic wave filter element; and switching means capable of selecting from a first condition wherein said amplified first filtered signal is supplied to a signal output terminal and a second condition wherein said amplified first filtered signal supplies said amplified first filtered signal to said second filter means which outputs said amplified second filtered signal to said signal output terminal, in said first condition, said second filter means is not operated and in said second condition, said second filter means is operated, said switching means including first switching means arranged between said first filter means and said signal output terminal, and second switching means for controlling operations of said second amplifier element and said first switching means by means of a switching signal.

4. A circuit according to claim 3, wherein said second switching means comprises:

a switching transistor turned on/off in accordance with a level of said switching signal; and said first switching means comprises:

diode means, coupled to said switching transistor and said first amplified element, and enabled in response to an ON/OFF operation of said switching transistor.

5. A satellite broadcast receiving system, comprising:

means for receiving a satellite broadcast signal;

a converter means for converting said satellite broadcast signal received by said receiving means into a signal having a predetermined frequency thereby generating a converted signal;

a frequency converting means for converting said converted signal into a signal having an intermediate frequency thereby generating an intermediate signal;

first filter means having predetermined frequency characteristics for filtering said intermediate frequency of said intermediate signal and outputting an amplified first filtered signal, said first filter means includes a first surface acoustic wave filter element and a first amplifier element connected to said first surface acoustic wave filter element, said first amplifier element compensating a signal from said first surface acoustic wave filter element;

second filter means, coupled in series with said first filter means having frequency characteristics of a band narrower than that of said frequency characteristics of said first filter means for filtering said amplified first filtered signal output from said first filter means, and outputting an amplified second filtered signal, said second filter means including a second surface acoustic wave filter element and a second amplifier element connected to said second surface acoustic wave filter element, said second amplifier element compensating a signal from said second surface acoustic wave filter element; and switching means for outputting a selected signal from a signal output terminal, capable of selecting from a first condition wherein said amplified first filtered signal is supplied to said signal output terminal and a second condition wherein said first filter means supplies said amplified first filtered signal to said second filter means which outputs said amplified second filtered signal to said signal output terminal, in said first condition, said second filter means is not operated and in said second condition, said second filter means is operated, said switching means including first switching means arranged between said first filter means and said signal output terminal, and second switching means for controlling operations of said second amplifier element and said first switching means by means of a switching signal; and demodulating means for demodulating said selected signal output by said switching means.

6. A system according to claim 5, wherein said second switching means comprising:

a switching transistor turned on/off in accordance with said level of said switching signal; and said first switching means comprising a diode means, coupled to said switching transistor and said first amplifier element, and enabled in response to an ON/OFF operation of said switching transistor.

* * * * *